United States Patent
Gambino et al.

(10) Patent No.: US 6,989,105 B2
(45) Date of Patent: Jan. 24, 2006

(54) DETECTION OF HARDMASK REMOVAL USING A SELECTIVE ETCH

(75) Inventors: Jeffrey P. Gambino, Westford, VT (US); Anthony K. Stamper, Williston, VT (US); Richard E. Wistrom, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 10/604,136

(22) Filed: Jun. 27, 2003

(65) Prior Publication Data

US 2004/0262256 A1    Dec. 30, 2004

(51) Int. Cl.
H01L 21/00    (2006.01)
B44C 1/22    (2006.01)

(52) U.S. Cl. ............................ 216/67; 213/13; 213/17; 213/18; 438/706; 438/723

(58) Field of Classification Search ................ 438/706, 438/723; 216/13, 17, 18, 67, 41
See application file for complete search history.

(56) References Cited

U.S. PATENT DOCUMENTS

| | | | |
|---|---|---|---|
| 3,782,836 A | 1/1974 | Fey et al. | |
| 4,194,127 A | 3/1980 | Schmidt | |
| 4,449,818 A | 5/1984 | Yamaguchi et al. | |
| 4,652,757 A | 3/1987 | Carver | |
| 4,680,084 A | 7/1987 | Heimann et al. | |
| 4,840,487 A | 6/1989 | Noguchi et al. | |
| 4,925,298 A | 5/1990 | Dobrilla | |
| 5,406,367 A | 4/1995 | Sopori | |
| 5,581,346 A | 12/1996 | Sopori | |
| 5,757,474 A | 5/1998 | Sopori et al. | |
| 5,893,749 A * | 4/1999 | Matumoto | 438/627 |
| 6,187,600 B1 | 2/2001 | Fujisawa et al. | |
| 6,451,673 B1 * | 9/2002 | Okada et al. | 438/513 |
| 6,613,666 B2 * | 9/2003 | Ma | 438/637 |
| 6,635,185 B2 * | 10/2003 | Demmin et al. | 216/64 |
| 2002/0108929 A1 * | 8/2002 | Ho et al. | 216/58 |
| 2003/0027419 A1 * | 2/2003 | Chen | 438/638 |
| 2003/0109143 A1 * | 6/2003 | Hsieh et al. | 438/710 |

FOREIGN PATENT DOCUMENTS

| | | |
|---|---|---|
| JP | 59212741 | 12/1984 |
| JP | 60101942 | 6/1985 |

* cited by examiner

*Primary Examiner*—Shamim Ahmed
(74) *Attorney, Agent, or Firm*—Schmeiser, Olsen & Watts; William D. Sabo

(57) ABSTRACT

A method of creating electrical shorts within an interconnection structure, using a selective etch, to detect a region that is missing a protective hardmask in order to prevent future use of the defective device.

16 Claims, 7 Drawing Sheets

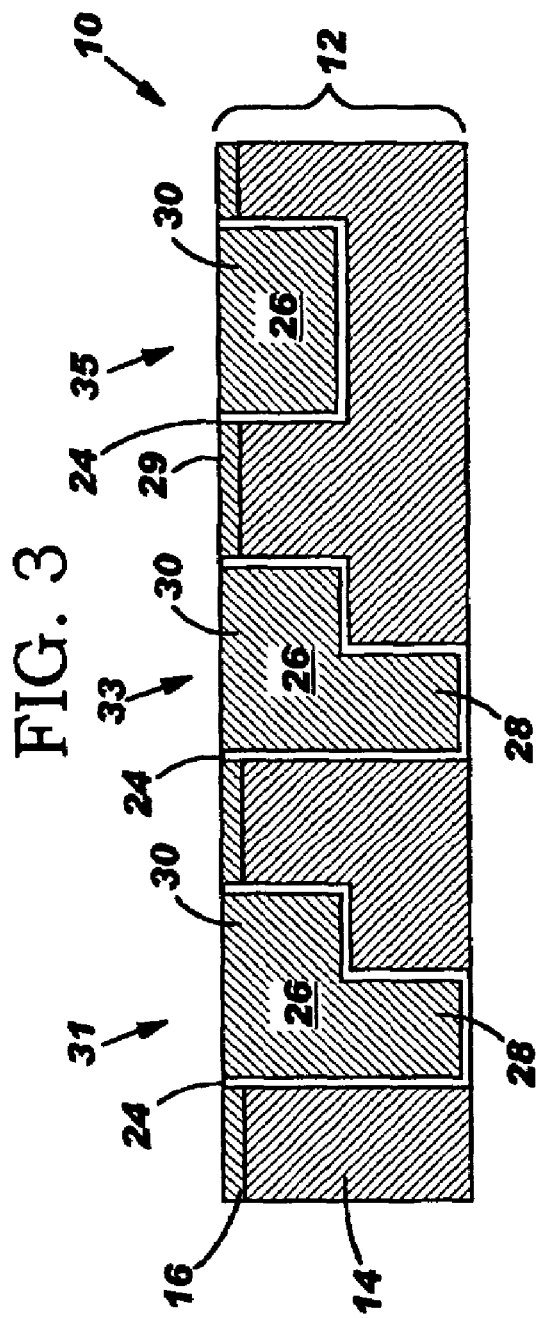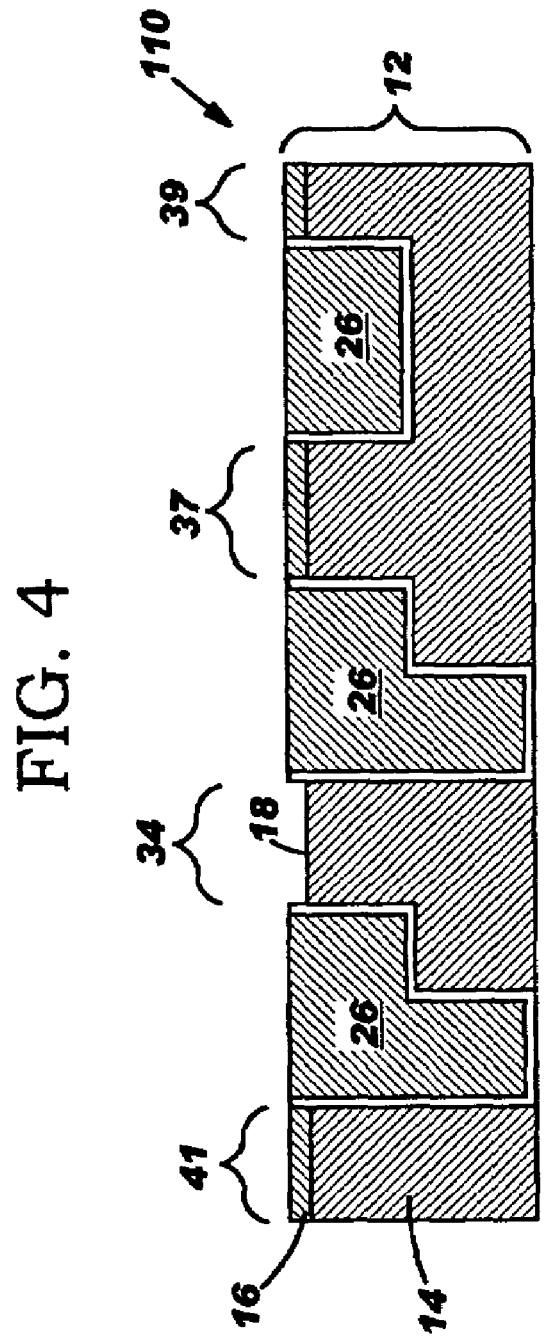

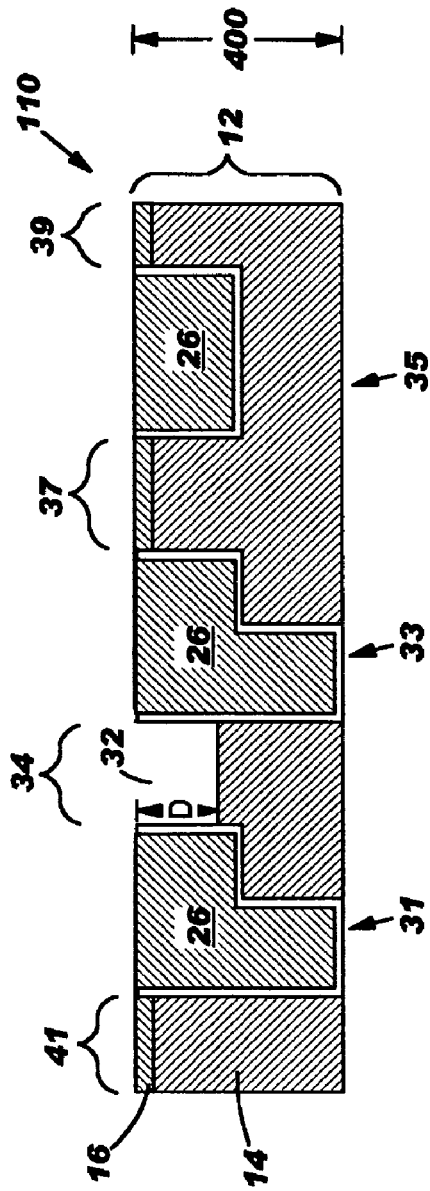
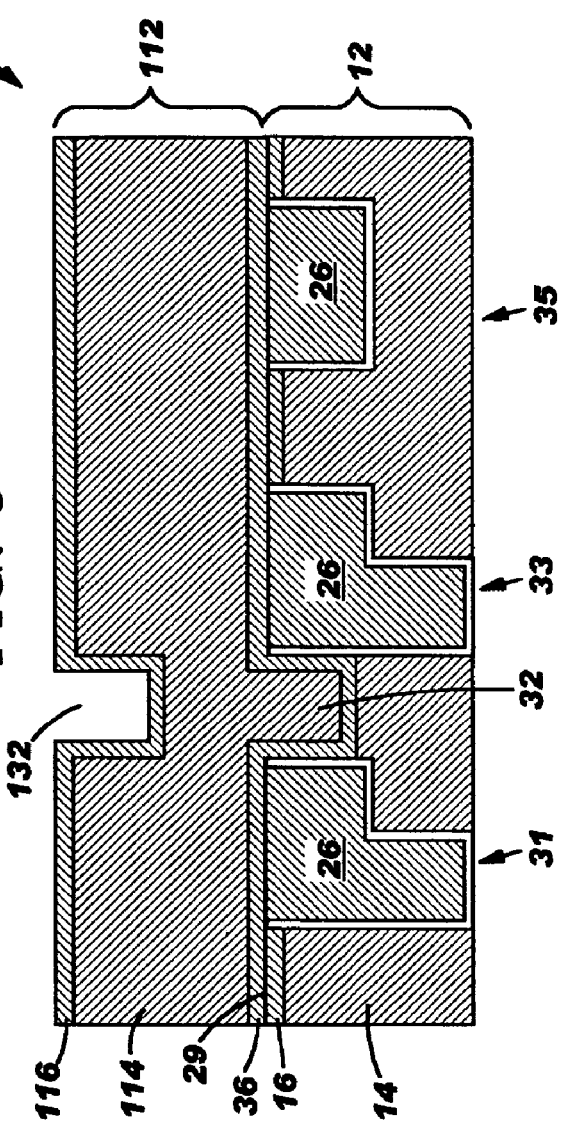

DETECTION OF HARDMASK REMOVAL USING A SELECTIVE ETCH

BACKGROUND OF INVENTION

1. Technical Field

The present invention relates generally to interconnect semiconductor structures, and more particularly, to a method of detecting devices lacking at least a portion of a protective hardmask covering an underlying material.

2. Related Art

A hardmask can be deposited over a dielectric layer during the formation of damascene structures. The hardmask acts as an etch stop layer and/or a chemical-mechanical polish (CMP) stop layer during the formation of conductive features within the dielectric layer. The hardmask also acts as a protective barrier preventing ambient moisture from diffusing into the dielectric layer. Moisture that diffuses into the dielectric layer can eventually attack the conductive features within the dielectric layer and lead to catastrophic device failure. Clearly, it is undesirable to have regions of the dielectric layer that do not have the protective hardmask thereover.

Unfortunately, portions of the hardmask can be inadvertently removed during the chemical-mechanical polishing (CMP) of the conductive features within the dielectric layer. This is particularly problematic in regions of high metal density. Regions are considered high metal density regions when the ratio of the conductive features to the spaces between the conductive features is greater than 50%. For example, a grouping of conductive wires having a width of 1.8 microns spaced about 0.2 microns apart would be characterized as having 90% metal density. This type of region would be especially susceptible to hardmask removal. The removal of the hardmask occurs because the CMP polishes through the conductive material, e.g., copper, much faster than the hardmask. Since the conductive features are so close together the small islands of hardmask extending above the plane of the conductive features are often removed during the CMP polish.

The problem arises in detecting those devices having regions that are lacking the protective hardmask before the device is implemented, or shipped to the end user. Therefore, there is a need in the industry for a method of detecting devices having regions lacking a protective hardmask.

SUMMARY OF INVENTION

The present invention provides a method that solves the above problems associated with the formation of an interconnection structure.

A first aspect of the invention provides a method of detecting an interconnection structure having a region within a first wiring level wherein a second layer is not covering a first layer, comprising: providing the first layer having the second layer on a surface of the first layer; and creating a recess in the first layer in the region where the second layer is not covering the first layer.

A second aspect of the invention provides a structure comprising: a first wiring level of the structure comprising: a first layer covering a surface of the structure; a second layer substantially covering a surface of the first layer; and a recess formed in a region of the structure where the second layer does not cover the first layer; and a second wiring level of the structure comprising: a third layer having a replicated recess in the third layer in the region of the structure where the second layer does not cover the first layer.

A third aspect of the invention provides a method of forming an interconnection structure, comprising: using recessed topography formed within a first layer of the structure to indicate the absence of a hardmask covering the first layer.

The foregoing and other features and advantages of the invention will be apparent from the following more particular description of the embodiments of the invention.

BRIEF DESCRIPTION OF DRAWINGS

The embodiments of this invention will be described in detail, with reference to the following figures, wherein like designations denote like elements, and wherein:

FIG. 3 depicts deposition of a conductive material within the trenches of FIG. 2 forming the dual damascene conductive features within a first wiring level;

FIG. 4 depicts the first wiring level of the dual damascene structure having a region of the first dielectric layer that is missing the first hardmask;

FIG. 5 depicts the structure of FIG. 4 having a step formed in the region of the first dielectric layer missing the first hardmask;

FIG. 6 depicts a second wiring level of the structure of FIGS. 4 and 5 wherein the step in the first wiring level is replicated in the second wiring level;

DETAILED DESCRIPTION

Although certain embodiments of the present invention will be shown and described in detail, it should be understood that various changes and modifications might be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

The present invention is applicable to the formation of semiconductor interconnect structures, i.e., those structures containing high electrical conductivity metals or alloys, such as copper, aluminum, silver, etc. The formation of a dual damascene structure is described herein for the purposes of illustration only. The disclosure is equally applicable to the formation of a single damascene structure, as well as numerous other interconnect structures.

Figure 1:
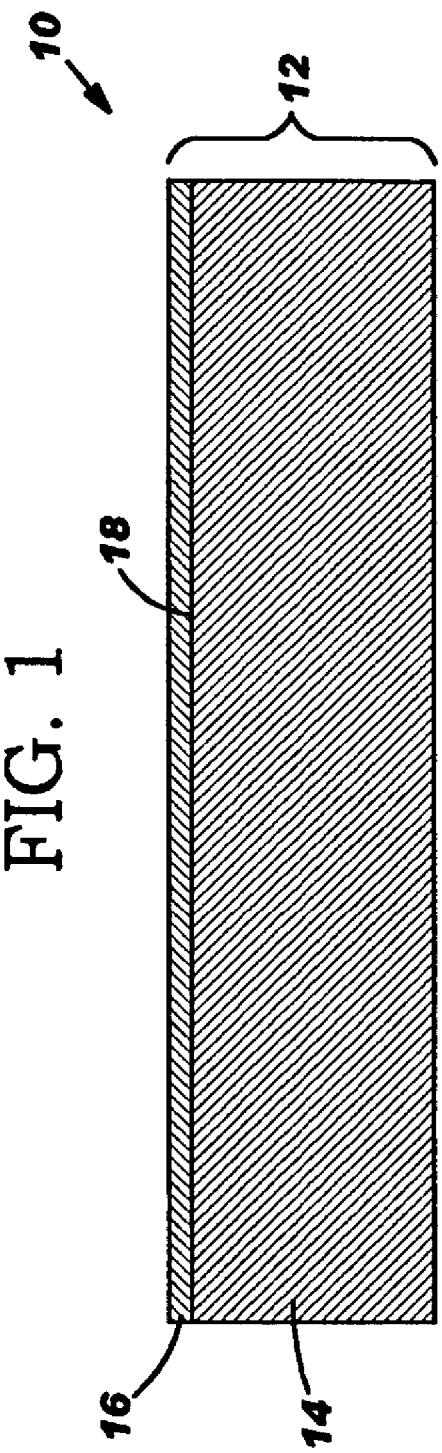
FIG. 1 depicts a first dielectric layer and a first hardmask of an interconnection structure.

FIG. 1 shows a first metal wiring level 12 of an interconnection structure 10. The first metal wiring level 12 includes a first dielectric layer 14, and a first hardmask 16 deposited over a surface 18 of the first dielectric layer 14. The first dielectric layer 14 and the first hardmask 16 are formed using techniques well known to those skilled in the art. The first dielectric layer 14 may comprise a dielectric material that etches selectively to the first hardmask 16, and may have an effective dielectric constant within the range of 1–4, optimally 2–3. For example, the first dielectric layer 14 may comprises a SiLK™ (Dow Chemical Company) semiconductor dielectric resin, or any polymer dielectric, such as, Teflon, bezocyclobutane-BCB, parylene-N, parylene-F, SiCOH, porous $SiO_2$, silica aerogels, and Flare™ (Honeywell), etc. The first hardmask 16 may comprise one or more layers of inorganic materials, such as $SiN_x$, $SiO_xN_y$, $SiC_x$, $SiO_xC_y$, $SiC_xN_y$, $SiO_2$, and $SiC_xO_yH_z$, or other similarly used materials having a significantly lower etch rate than the first dielectric layer 14. It should be noted that the first hardmask 16 is shown having only one layer for ease of illustration, but may comprise multiple layers. The first hardmask 16 acts as a protective barrier preventing moisture from diffusing into the first dielectric layer 14.

The first hardmask 16 also prevents the first dielectric layer 14 from being damaged during CMP, reactive ion etch (RIE), photoresist strip processes, and other similar processes performed during the formation of the structure 10. As mentioned in the Background, moisture that diffuses into the first dielectric layer 14 can eventually attack the conductive features within the first dielectric layer 14 and lead to catastrophic device failure. The first hardmask 16 also acts as an etch stop layer during the formation of conductive features within the first dielectric layer 14.

Figure 2:
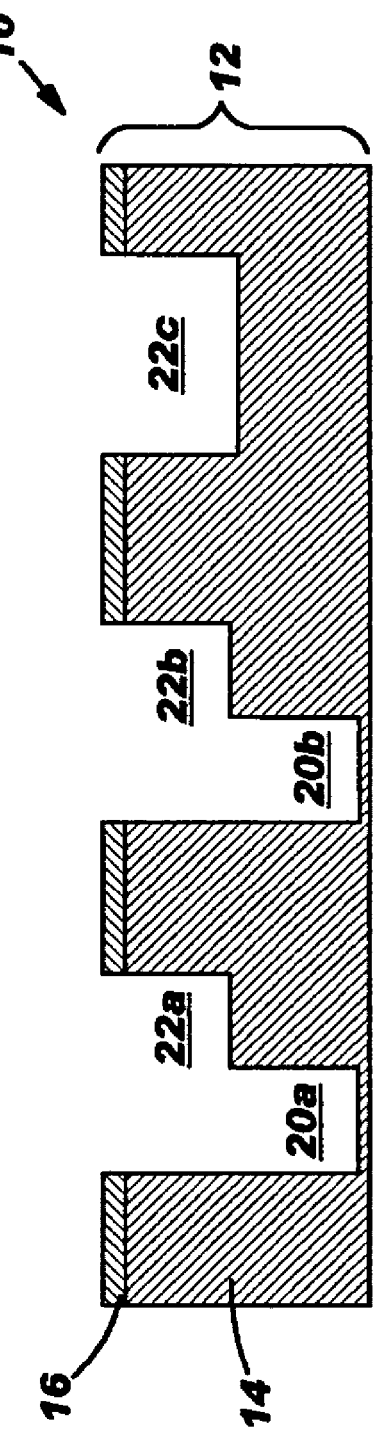
FIG. 2 depicts the formation of trenches within the first dielectric layer and first hardmask of the structure of FIG. 1.

As illustrated in FIG. 2, a first trench 20a, 20b is formed within the first dielectric layer 14 in the location of a first and a second conductive feature, respectively, (see FIG. 3). A second trench 22a, 22b, 22c is formed within the first dielectric layer 14 in the location of the first, second and third conductive features, respectively, (see FIG. 3). As illustrated, the first and second trenches 20a–b, 22a–c have different cross-sections. The first and second trenches 20a–b, 22a–c are formed in accordance with processes known in the art. As illustrated in FIG. 3, a liner 24, that conformally coats the inner walls of the first and second trenches 20a–b, 22a–c, is deposited within the first and second trenches 20a–b, 22a–c forming via and wire trenches, respectively. The liner 24 may comprise a refractory metal, such as tantalum-based materials, tungsten-based materials, titanium-based materials, or other similar materials, or other refractory metals, and may be deposited using known deposition techniques. The liner 24 prevents the conductive material that will be deposited within the first and second trenches 20a–b, 22a–c from diffusing into the first dielectric layer 14.

As illustrated in FIG. 3, the first and second trenches 20a–b, 22a–c are then filled with a conductive material 26, such as copper, gold, platinum, silver, etc. The conductive material 26 may be deposited using known deposition techniques, such as plasma vapor deposition (PVD), chemical vapor deposition (CVD), or other techniques. Following deposition of the conductive material 26, a chemical-mechanical polish (CMP), or other similar polishing technique, may be used to remove excess conductive material 26 extending beyond, and on top of, a surface 29 of the hardmask 16, thereby forming a first conductive feature 31, a second conductive feature 33 and a third conductive feature 35. In this example, the first trench 20 (see FIG. 2) forms a conductive via 28 of the conductive features 31, 33 and the second trench 22 (see FIG. 2) forms a conductive line or wire 30 of the conductive features 31, 33, 35.

Prior to the formation of a subsequent or second metal wiring level 112 (see FIGS. 6–8), a capping or barrier layer 36 is deposited over the exposed surface 29 of the first metal wiring level 12 (refer to FIG. 6). The capping layer 36 prevents the copper 26 within the conductive features 31, 33, 35 from diffusing into the second dielectric layer 114 within the second wiring level 112 (see FIGS. 6–8) during processing. The capping layer 36 can also be used as a RIE stop layer for subsequent via formation. As is known in the art, however, there are often problems adhering an inorganic capping layer 36 to the copper 26 within the conductive features 31, 33, 35. Therefore, prior to the deposition of the capping layer 36 the exposed copper 26 within the conductive features 31, 33, 35 is subjected to a reducing plasma preclean process.

Conditions and reducing plasmas similar to those described in U.S. Pat. Nos. 6,261,951 B1 and 6,255,217 B1 may be used, and are incorporated herein by reference. For example, reducing plasmas such as $H_2$, $N_2$, $NH_3$ and noble gases such as nitrogen, helium, etc., may be used in the present invention. The reducing plasma preclean process may be performed in a conventional plasma deposition apparatus that is capable of generating plasma gas.

The reducing plasma preclean process not only causes the capping layer 36 to adhere to the copper 26 within the conductive features 31, 33, 35, but the conditions of the process can be manipulated in order to detect devices that have regions 34 of the first hardmask 16 missing from the surface 18 of the first dielectric layer 14, or are of an insufficient thickness to protect the first dielectric layer 14, e.g., a thickness less than 50 nm. As mentioned in the Background, regions 34 of the first dielectric layer 14 where the first hardmask 16 is missing are susceptible to the diffusion of water into the first dielectric layer 14 (refer to FIG. 4). The water may then attack the copper 26 within the conductive features 31, 33, 35, which in turn can lead to catastrophic device failure. Therefore, it is undesirable to have regions 34 wherein the first hardmask 16 is missing from, or not sufficiently covering, the first dielectric layer 14. In accordance with the present invention, the reducing plasma preclean process is used to intentionally damage any device 110 wherein the first hardmask 16 is missing from, or not covering, the surface 18 of the first dielectric layer 14.

In particular, the plasma used in the reducing plasma preclean process selectively etches the first dielectric layer 14 with a selectivity preferably greater than 10:1 which leaves the first hardmask 16 nearly unetched. In an optimal embodiment the selectivity of the reducing plasma preclean process would be infinite.

FIGS. 4 and 5 illustrate the selectivity of the reducing plasma preclean process. FIG. 4 shows a structure 110 before the reducing plasma preclean process is performed. The structure 110 has a first region 34 where the first hardmask 16 is not covering the surface 18 of the first dielectric layer 14, and a second region 37, a third region 39 and a fourth region 41 where the first hardmask 16 is covering the first dielectric layer 14. The first hardmask 16 may have been inadvertently removed in region 34 during the CMP process, or other similar process, used to planarize the conductive features 31, 33, 35. FIG. 5 shows the structure 110 after the reducing plasma preclean process has been performed. At least a portion of the first dielectric layer 14 has been removed in region 34, to a depth D, by the reducing plasma preclean process, creating a recessed topography or a step 32 in the region 34 where the first hardmask 16 was not covering the first dielectric layer 14. In contrast, the first dielectric layer 14 is not etched in regions 37, 39, 41 where the first hardmask 16 covers the first dielectric layer 14. As clearly illustrated, the region 34 of the first dielectric layer 14 that does not have the first hardmask 16 thereover will be etched during the reducing plasma preclean process, while the regions 37, 39, 41 of the first dielectric layer 14 that do have the first hardmask 16 thereover will not be etched.

It should be noted that only one region 34 is shown lacking the first hardmask 16, consequently, only one step 32 is created in the first dielectric layer 14. This is intended for simplicity of illustration only, and is in no way intended to limit the scope of the invention.

As illustrated in FIG. 6, the optional capping layer 36 is then deposited over the surface 29 of the structure 110 following the reducing plasma preclean process has been performed. Because the reducing plasma preclean process etches the surface of the copper 26 within the conductive features 31, 33, 35, the capping layer 36 adheres properly to the surface 29 of the structure 110. The capping layer 36 may comprise an inorganic material, such as SiC, SiN, or other similar materials. The capping layer 36 may be deposited using conventional vapor deposition techniques, such as chemical vapor deposition, low pressure chemical vapor deposition, high pressure chemical vapor deposition, high density plasma chemical vapor deposition (HDPCVD), plasma enhanced chemical vapor deposition (PECVD), and other similar vapor deposition techniques.

Thereafter, the layers of a second wiring level 112 are deposited. In particular, a second dielectric layer 114 is deposited over the capping layer 36, and a second hardmask 116 is deposited over the second dielectric layer 114. Because the capping layer 36, second dielectric layer 114 and second hardmask 116 are conformal, or partially conformal, the step 32 created in the first wiring level 12, due to the missing hardmask 16, is replicated as a second recessed topography or replicated recess or step 132 in second wiring level 112.

Figure 7:
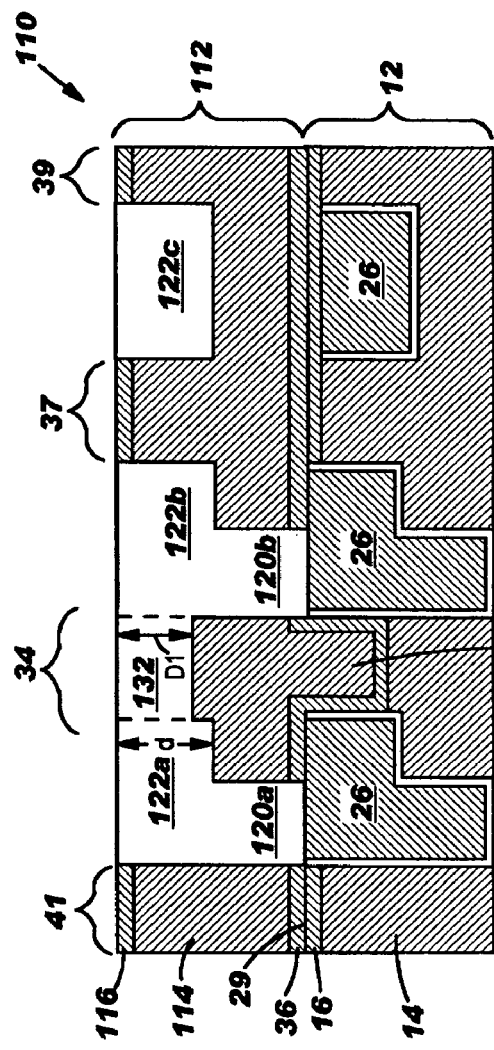
FIG. 7 depicts the structure of FIG. 6 following the formation of trenches within the second dielectric layer and second hardmask of the second wiring level.

As illustrated in FIG. 7, a first trench 120a, 120b is formed within the second dielectric layer 114 in the location where a first and a second conductive feature, respectively, of the second wiring level 112 are supposed to be formed. A second trench 122a, 122b, 122c is formed within the second dielectric layer 114 in the location where the first, second and third conductive features, respectively, of the second wiring level 112 are supposed to be formed. The first and second trenches 120a–b, 122a–c are patterned and etched in accordance with processes known in the art, and are normally similar to the conductive features formed in the first wiring level 12 (see FIG. 3). The first and second trenches 120a–b, 122a–c may also include an optional liner 124 conformally coating the inner walls of the first and second trenches 120a–b, 122a–c. As with the liner 24 of the first wiring level 12, the liner 124 of the second wiring level 112 may comprise a refractory metal, such as tantalum-based materials, tungsten-based materials, titanium-based materials, or other similar materials, and may be deposited using known deposition techniques. The liner 24 prevents the conductive material that will be deposited within the first and second trenches 120a–b, 122a–c from diffusing into the second dielectric layer 114.

As FIG. 7 illustrates, the trenches 122a and 120b that are adjacent the replicated step 132 (see FIG. 6) in region 34 are not formed properly. Specifically, the second trench 122a of the first conductive feature 131 (FIG. 8) and the first trench 120b of the second conductive feature 133 (FIG. 8) cut into the replicated step 132. As a result, the boundaries of the second trench 122a of the first conductive feature 131 and the first trench 120b of the second conductive feature 133 do not exist. Rather, the second trench 122a of the first conductive feature 131 and the first trench 120b of the second conductive feature 133 blend together with the replicated step 132 (FIG. 6). It should be noted that the dotted lines are inserted only for clarity to show where the replicated step 132 is located with respect to the trenches 122a, 120b, no boundaries actually exist. In contrast, the trenches 120, 122 adjacent to regions 37, 39, 41 of the structure 110, where the first hardmask 16 covers the first dielectric layer 14, are formed properly. Specifically, going from left to right, the first trench 120a adjacent region 41, the second trench 122b adjacent region 37 and the second trench 122c adjacent region 39 are formed properly.

It should be noted that the replicated step 132 in the second wiring level 112 replicates to a depth D1, and the second trench 122a is formed to a depth d. In this example, the depth D1 of the replicated step 132 is less than the depth d of the second trench 122a. The replicated step 132, however, may be formed to a depth D1 greater than, or equal to, the depth d of the second trench 122a.

Figure 8:
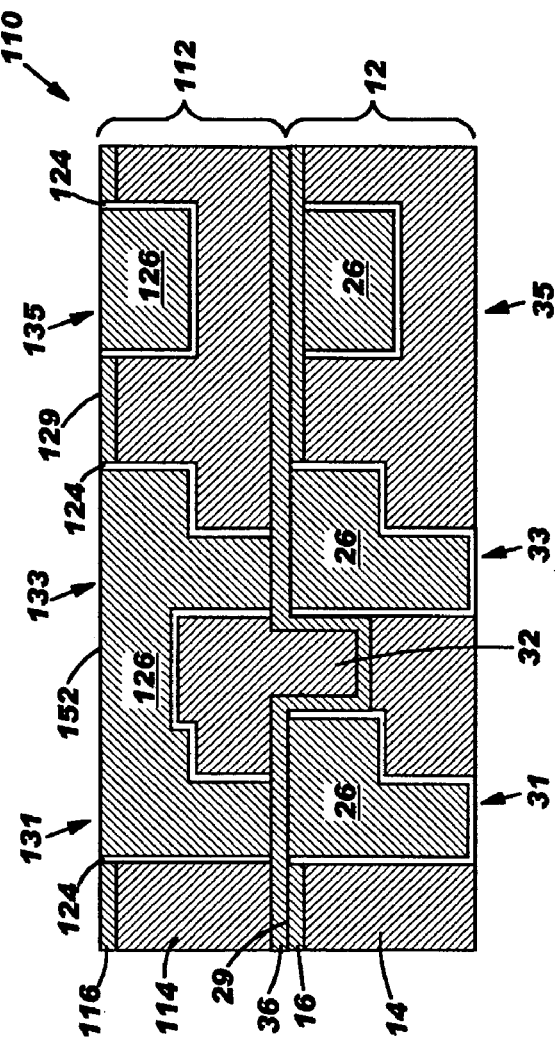
FIG. 8 depicts deposition of a conductive material within the trenches of FIG. 7 forming the dual damascene conductive features in the second wiring level.

As illustrated in FIG. 8, the replicated step 132 (FIG. 7) and the first and second trenches 120a–b, 122a–c are filled with a liner 124 and a conductive material 126, as described above. Following deposition of the conductive material 126, a chemical-mechanical polish (CMP), or other similar polishing technique, may be used to remove excess liner 124 and conductive material 126 extending beyond, and on, a surface 129 of the second hardmask 116.

A third conductive feature 135 in the second wiring level 112 is formed properly, similar to the third conductive feature 35 of the first wiring level 12. A first 131 and a second 133 conductive feature of the second wiring level 112, however, are not formed properly in a manner similar to the first 31 and second 33 conductive features of the first wiring level 12. Rather, the replicated step 132 in the second wiring level 112 (see FIG. 7) fills with conductive material 126 producing an electrically shorted region 152 between what was supposed to be the first and second conductive features 131, 133. Due to the electrical short the device will not function properly. Non-functioning devices are removed from a batch of devices, thereby protecting the manufacturer from inadvertently implementing a defective device, or sending a defective device to an end user.

Figure 9A:
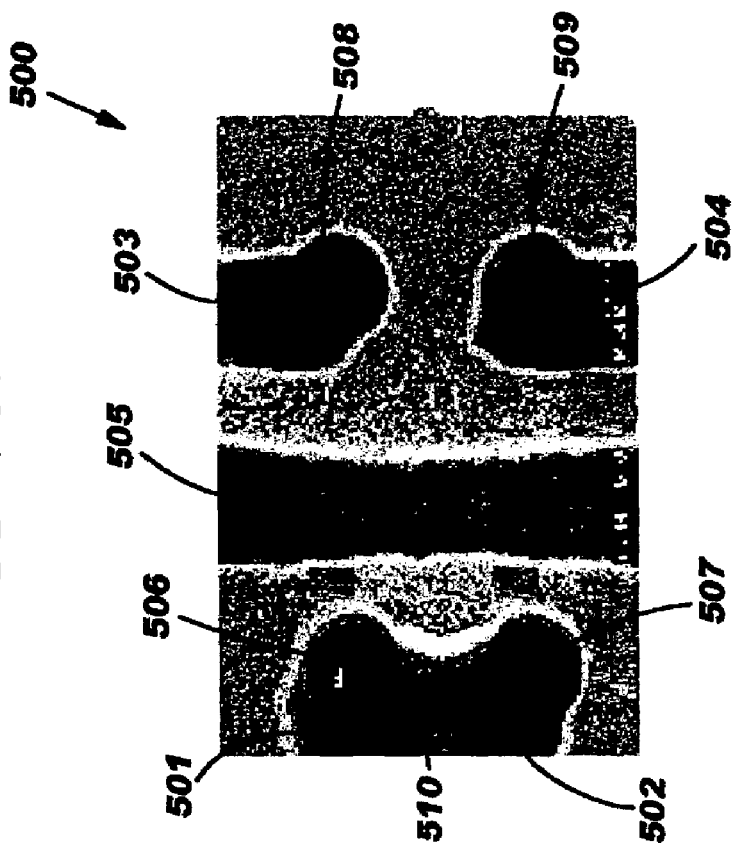
FIG. 9A depicts a photograph of a structure having a shorted region and a non-shorted region.
Figure 9B:
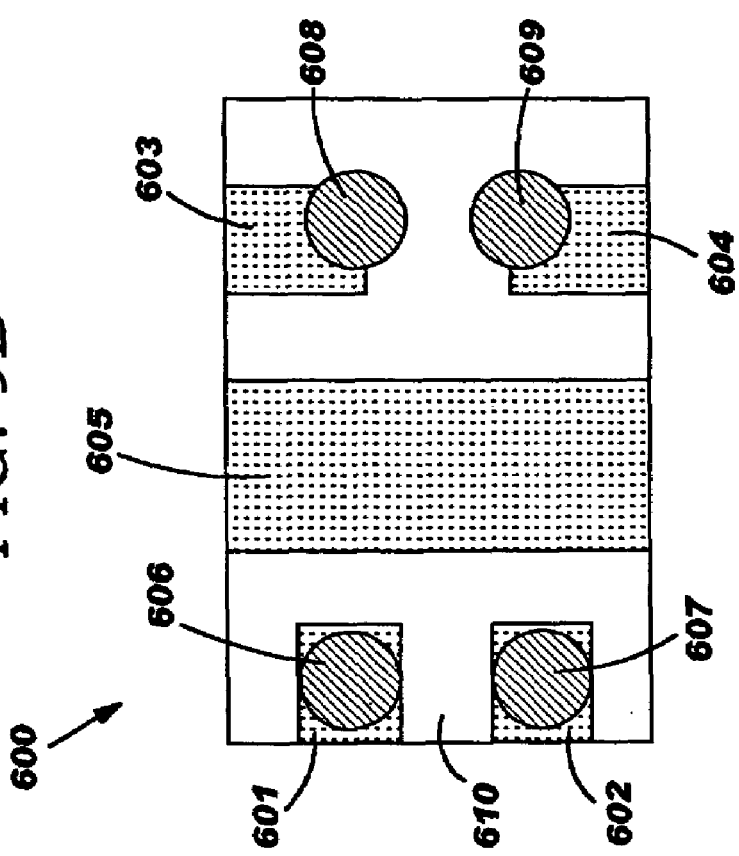
FIG. 9B depicts a drawing illustrating proper formation of a structure.

FIG. 9A is a photograph showing a top view of a structure 500 similar to structure 110 that had a recess formed within a first dielectric layer thereby creating an electrical short. In particular, FIG. 9A shows a plurality of wires 501–505 and a plurality of vias 506–509. Wires 501, 502 and vias 506, 507 are electrically shorted together because region 510 between wires 501, 502 and vias 506, 507 was lacking sufficient first hardmask 16 to prevent etching of the first dielectric layer 14 during the reducing plasma preclean process (see FIGS. 1–8). In contrast, the wires 503–505 and vias 508, 509 are not electrically shorted together because there was sufficient first hardmask 16 surrounding the wires 503–505 and vias 508, 509 to prevent etching of the first dielectric layer 14 during the reducing plasma preclean process. FIG. 9B is a drawing of a similar structure 600 that illustrates a properly formed structure. Specifically, wires 601, 602 and vias 606, 607 are not shorted together in region 610 because there was a sufficient amount of first hardmask 16 covering the first dielectric layer 14 in region 610 to prevent the reducing plasma preclean process from etching the first dielectric layer 14 in region 610.

The degree to which the first dielectric layer 14 is etched in the regions 34 where the hardmask 16 is not covering the first dielectric layer 14 depends upon the conditions of the reducing plasma preclean process. Steps 32 having a sufficient depth D, in this example a depth D of approximately 100 nm or greater, will produce shorts within the second metal wiring level 112. Obviously, the deeper the step 32 formed by the reducing plasma preclean process, and the faster the step 32 is formed, the more easily the defective device will be shorted and be discovered.

The outcome of the reducing plasma preclean process varies depending upon the conditions selected from a group of preclean conditions. The group of preclean conditions that may be varied during the reducing plasma preclean process include the etching or plasma material used to preclean the surface of the conductive features 31, 33, 35, the temperature at which the process is performed (room temperature to 500 Â° C.), the time or duration of the process (10–60 seconds), the pressure at which the process is performed and the rf power. Varying at least one of the conditions in the group of preclean conditions will alter the depth D of the step 32 in the first dielectric layer 14.

Therefore, the preclean conditions can be intentionally manipulated to produce the desired step 32 depth D within the first dielectric layer 14. Several examples follow that illustrate the effect of altering different preclean conditions of the reducing plasma preclean process on the creation of steps 32 within the first dielectric layer 14. It should be noted that these are not intended to encompass all the possible reducing plasma preclean process conditions and results.

EXAMPLE 1

The temperature at which the reducing plasma preclean process is performed can alter the depth D to which the step 32 is created within the first dielectric layer 14. As mentioned above, the temperature may range from room temperature to approximately 500 Â° C.

An $H_2$ reducing plasma preclean process, performed at approximately 5 mTorr and 4500 W rf power, will etch a SiLK dielectric layer 14 of a 200 mm wafer in areas where a first hardmask 16 is missing to a depth D at a rate of approximately 1.0 microns per minute at 100 Â° C. In contrast, under the same conditions the $H_2$ reducing plasma preclean process will etch to a depth D at a rate of approximately 2.0 microns per minute at 400 Â° C. Clearly, in this example it is advantageous to perform the reducing plasma preclean process at a higher temperature because it produces deeper steps 32 within the first dielectric layer 14 for a given etch time. In turn, the device is more likely to produce shorts within the second or subsequent wiring levels, and is therefore easier to detect as a failed device.

EXAMPLE 2

The use of different plasma materials may also alter the depth D to which the steps 32 are created within the first dielectric layer 14. As mentioned above, reducing plasmas such as $H_2$, $N_2$, $NH_3$ and noble gases such as nitrogen, helium, etc., may be used in the present invention.

During a ~30 second plasma heat-up step a HDPVD process etches a SiLK dielectric layer 14 to a depth of approximately 1000 nm. In contrast, during about a ~30 second plasma heat-up step a nitrogen plasma etches a SiLK dielectric layer 14 to a depth of approximately 800 nm.

EXAMPLE 3

A PECVD process, using NH3 plasma, a parallel plate reactor, a heated wafer chuck, performed at 5 Torr and an rf power of 500 W for 20 seconds will etch 200 nm of SiLK dielectric within a 200 mm wafer.

Figure 10A:
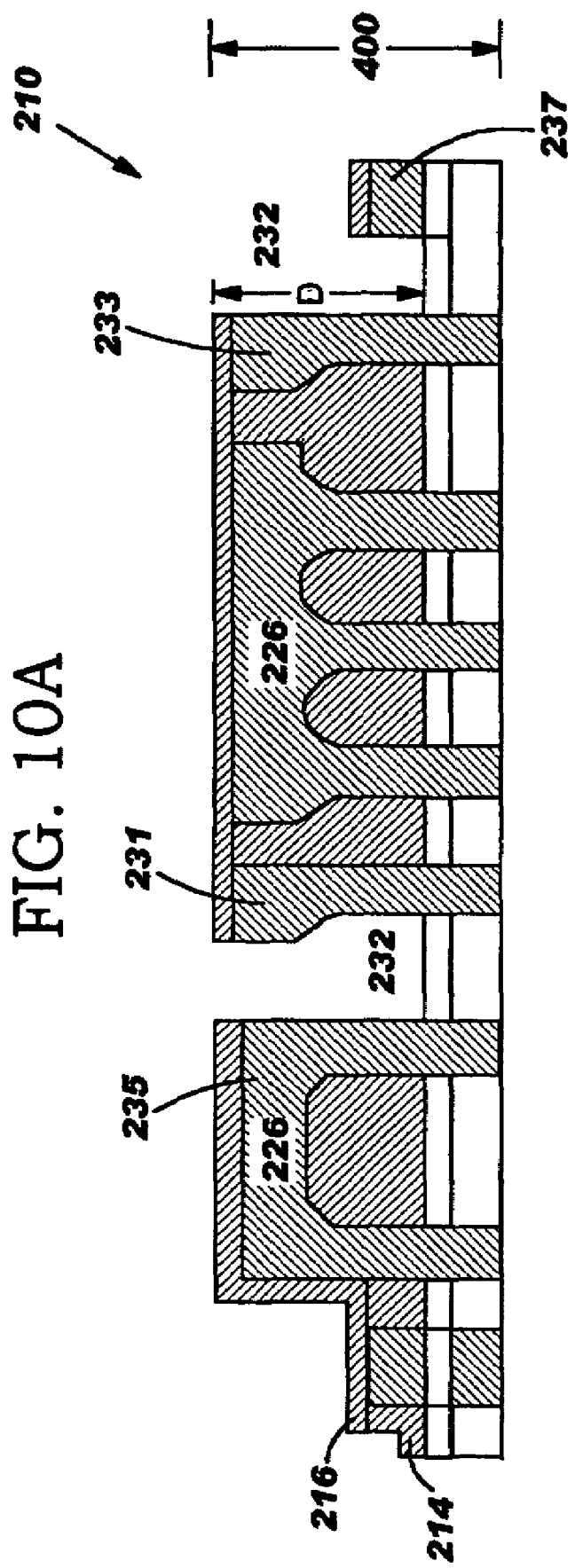
FIG. 10A depicts a structure in accordance with a second embodiment of the present invention before etching.
Figure 10B:
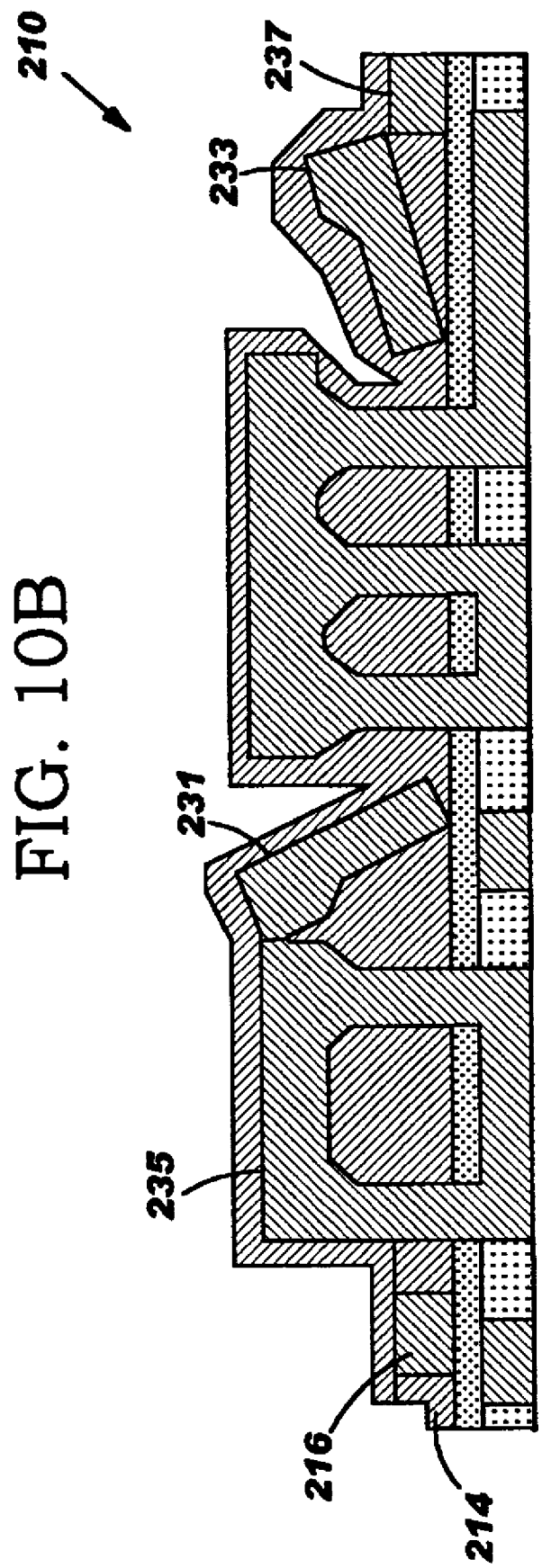
FIG. 10B depicts a structure in accordance with a second embodiment of the present invention after etching.

The above has described and illustrated the present invention in terms of a recess 32 that is etched to a depth D that is less than the depth 100 of the first dielectric layer 14 (see FIG. 5). FIGS. 10A and 10B illustrate an alternative structure 210 wherein the depth D of the recess 232 is approximately equal to the depth 400 of a first dielectric layer 214. As a result, conductive features 231, 233 have no support on at least one side of the conductive feature 231, 233 and fall over onto adjacent conductive features 235, 237, respectively. This results in catastrophic device failure in this, as well as the second wiring level (not shown) constructed thereon.

As mentioned above, the structure is susceptible to recess formation in regions where the first hardmask 16 is completely missing from the surface of the first dielectric layer 14. Although also mentioned above, it should be emphasized that regions where the first hardmask 16 covers the first dielectric layer 14 but has a thickness much less than 50 nm may also become etched during the reducing plasma preclean process because the reducing plasma preclean process does not have infinite selectivity to first hardmask 16. As a result, recesses in first dielectric layer 14 will form in these regions as well.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of detecting an interconnection structure having a region within a first wiring level wherein a second layer is not covering a first layer, comprising:
    providing the first layer having the second layer on a surface of the first layer;
    forming an at least one conductive feature within the first and second layers; and
    performing a process to clean an exposed surface of the conductive feature, wherein the process forms a recess in the first layer in the region where the second layer is not covering the first layer.

2. The method of claim 1, wherein the recess is created by selectively etching the first layer in the region where the second layer is not covering the first layer.

3. The method of claim 2, wherein at least one of a group of conditions of the selective etch are altered to change a depth of the recess, wherein the group of conditions is selected from a group consisting of: etching material, temperature, power, pressure, and duration of the process.

4. The method of claim 2, wherein the selective etch is performed by a reducing plasma preclean process.

5. The method of claim 4, wherein the reducing plasma preclean process uses a plasma selected from the group consisting of: $H_2$, $N_2$, $NH_3$ and noble gases.

6. The method of claim 1, wherein the first layer comprises a dielectric material.

7. The method of claim 1, wherein the second layer comprises a hardmask selected from a group consisting of: $SiN_x$, $SiO_xN_y$, $SiC_x$, $SiO_xC_y$, $SiC_xN_y$, $SiO_2$, and $SiC_xO_yH_z$.

8. The method of claim 1, wherein the first layer comprises a material that etches selectively to the second layer with a selectivity of greater than 1 to 1.

9. The method of claim 1, after creating a recess in the first layer, further comprising:
   forming a plurality of conductive features within a second wiring level of the structure.

10. The method of claim 9, wherein the conductive features comprise:
   a liner comprising a material selected from the group consisting of: tantalum-based materials, tungsten-based materials and titanium-based materials; and
   a conductive material selected from the group consisting of: copper, gold, platinum and silver.

11. The method of claim 9, wherein an electrical short between conductive features results if the recess in the first wiring level replicates in the second wiring level, wherein conductive features are selected from a group consisting of: wires, vias, and wires and vias.

12. The method of claim 11, further comprising:
   rejecting the interconnection structure if the recess replicates in the second wiring level.

13. A method of forming an interconnection structure, comprising:
   forming a first wiring level comprising a first layer, a second layer on a surface of the first layer, and at least one conductive feature within the first and second layers;
   performing a preclean process on a surface of the first wiring level, wherein the preclean process forms a recess within the first layer in a region of the first wiring level where the second layer does not cover the first layer; and
   forming a second wiring level on a surface of the first wiring level comprising a third layer on the surface of the first wiring level and a plurality of conductive features within the third layer, wherein the recess within the first layer of the first wiring level is replicated in the third layer the second wiring level producing an electrical short between at least two of the plurality of conductive features within the second wiring level.

14. The method of claim 13, wherein performing the preclean process on the surface of the first wiring level employs a reducing plasma preclean process.

15. The method of claim 14, wherein the reducing plasma preclean process etches the first layer selectively to the second layer.

16. The method of claim 14, wherein at least one of a group of conditions of the reducing plasma preclean process are altered to change a depth of the recess within the first layer, wherein the group of conditions is selected from a group consisting of: etching material, temperature, power, pressure, and duration of the process.

* * * * *